(12) United States Patent
Beon et al.

(10) Patent No.: US 12,684,998 B2
(45) Date of Patent: Jul. 14, 2026

(54) DISPLAY APPARATUS INCLUDING PHASE RETARDATION AND PHASE COMPENSATION LAYERS

(71) Applicant: Samsung Display Co., Ltd., Yongin-si (KR)

(72) Inventors: Beonghun Beon, Yongin-si (KR); Dukjin Lee, Yongin-si (KR); Hyosung Hong, Yongin-si (KR); Woosuk Jung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 449 days.

(21) Appl. No.: 18/317,183

(22) Filed: May 15, 2023

(65) Prior Publication Data

US 2023/0371347 A1     Nov. 16, 2023

(30) Foreign Application Priority Data

May 16, 2022     (KR) ........................ 10-2022-0059835
Jul. 28, 2022     (KR) ........................ 10-2022-0094030

(51) Int. Cl.
| | |
|---|---|
| *H10K 59/80* | (2023.01) |
| *H10K 50/80* | (2023.01) |
| *H10K 59/121* | (2023.01) |
| *H10K 50/844* | (2023.01) |
| *H10K 59/12* | (2023.01) |
| *H10K 59/122* | (2023.01) |
| *H10K 59/124* | (2023.01) |
| *H10K 102/00* | (2023.01) |

(52) U.S. Cl.
CPC ....... *H10K 59/8791* (2023.02); *H10K 50/868* (2023.02); *H10K 59/1216* (2023.02); *H10K 59/873* (2023.02); *H10K 50/844* (2023.02); *H10K 59/12* (2023.02); *H10K 59/122* (2023.02); *H10K 59/124* (2023.02); *H10K 2102/351* (2023.02)

(58) Field of Classification Search
CPC .. H10K 59/8791; H10K 59/873; H10K 59/12; H10K 59/122; H10K 59/1216; H10K 59/124; H10K 50/844; H10K 50/868; H10K 1/13363
See application file for complete search history.

(56) References Cited

U.S. PATENT DOCUMENTS

| | | |
|---|---|---|
| 7,884,363 B2 | 2/2011 | Hsu et al. |
| 8,421,708 B2 | 4/2013 | Han |

(Continued)

FOREIGN PATENT DOCUMENTS

| | | | | |
|---|---|---|---|---|
| CN | 108922903 A | * 11/2018 | ......... | H10K 59/8791 |
| JP | 2005063841 A | * 3/2005 | ......... | H10K 59/8791 |

(Continued)

*Primary Examiner* — Ida M Soward
(74) *Attorney, Agent, or Firm* — Innovation Counsel LLP

(57) ABSTRACT

A display apparatus includes a display panel including a display element and a thin-film encapsulation layer disposed on the display element, and a polarization film disposed on the display panel and including a polarization layer, a phase retardation layer, and a phase compensation layer, wherein a thickness direction phase difference $C_{Rth}$ of the phase compensation layer satisfies Equation: $C_{Rth} = -((Re \times \sin^2(2\Theta) \times NZ)/2 + A_{Rth})$.

20 Claims, 15 Drawing Sheets

(56) References Cited

U.S. PATENT DOCUMENTS

| | | | |
|---|---|---|---|
| 8,569,946 B2 | 10/2013 | Song et al. | |
| 8,742,408 B2 | 6/2014 | Lee et al. | |
| 8,742,526 B2 | 6/2014 | Iwabuchi et al. | |
| 8,803,167 B2 | 8/2014 | Koh et al. | |
| 8,890,179 B2 | 11/2014 | Lim et al. | |
| 9,252,396 B2 | 2/2016 | Sato | |
| 9,577,224 B2 | 2/2017 | Lee et al. | |
| 9,710,090 B2 | 7/2017 | Choi | |
| 9,768,413 B2 * | 9/2017 | Yim | H10K 59/12 |
| 10,033,013 B2 | 7/2018 | Moon et al. | |
| 10,367,171 B2 | 7/2019 | Song | |
| 10,466,399 B2 | 11/2019 | Lee | |
| 10,483,335 B2 | 11/2019 | Bang et al. | |
| 10,783,387 B2 | 9/2020 | Jung et al. | |
| 10,884,530 B2 | 1/2021 | Shin et al. | |
| 11,099,418 B2 | 8/2021 | Hwang et al. | |
| 11,282,820 B2 | 3/2022 | Takeya et al. | |
| 11,561,635 B1 * | 1/2023 | Liu | G06F 3/0412 |
| 2006/0132034 A1 | 6/2006 | Cho et al. | |
| 2014/0185267 A1 | 7/2014 | Kim et al. | |
| 2015/0357392 A1 | 12/2015 | You | |
| 2017/0222188 A1 * | 8/2017 | Lee | G02B 5/3016 |
| 2017/0285234 A1 | 10/2017 | Ohyama et al. | |
| 2018/0095211 A1 | 4/2018 | Lee et al. | |
| 2018/0149785 A1 | 5/2018 | Lee et al. | |
| 2019/0074478 A1 * | 3/2019 | Kwon | H10K 59/131 |
| 2020/0124921 A1 * | 4/2020 | Hai | G02F 1/133634 |
| 2020/0212367 A1 | 7/2020 | Kim et al. | |
| 2020/0264356 A1 | 8/2020 | Lee et al. | |
| 2020/0271844 A1 | 8/2020 | Lee et al. | |
| 2020/0287157 A1 * | 9/2020 | Seong | H10K 59/873 |
| 2021/0200365 A1 | 7/2021 | Lee et al. | |
| 2022/0123061 A1 | 4/2022 | Lee et al. | |
| 2022/0399511 A1 * | 12/2022 | Bok | B32B 27/06 |
| 2023/0345761 A1 * | 10/2023 | Hsiao | H10K 59/8722 |

FOREIGN PATENT DOCUMENTS

| | | | | |
|---|---|---|---|---|
| JP | 4452741 | | 4/2010 | |
| JP | 4852472 | | 1/2012 | |
| KR | 10-2003-0083529 | | 10/2003 | |
| KR | 10-0497154 | | 6/2005 | |
| KR | 20060036297 | * | 4/2006 | G02F 1/13363 |
| KR | 10-0637201 | | 10/2006 | |
| KR | 10-0671646 | | 1/2007 | |
| KR | 10-0811503 | | 3/2008 | |
| KR | 10-2013-0108207 | | 10/2013 | |
| KR | 10-1409525 | | 6/2014 | |
| KR | 10-2014-0085130 A | | 7/2014 | |
| KR | 10-2015-0142710 | | 12/2015 | |
| KR | 10-1636167 | | 7/2016 | |
| KR | 10-1694886 | | 1/2017 | |
| KR | 10-2017-0083685 | | 7/2017 | |
| KR | 10-1784804 | | 10/2017 | |
| KR | 20170114514 A | * | 10/2017 | G02B 5/3083 |
| KR | 10-1826849 | | 2/2018 | |
| KR | 10-1870457 | | 6/2018 | |
| KR | 10-2018-0078657 | | 7/2018 | |
| KR | 10-1917081 | | 11/2018 | |
| KR | 10-1943378 | | 1/2019 | |
| KR | 10-2019-0026617 | | 3/2019 | |
| KR | 10-2019-0036378 | | 4/2019 | |
| KR | 10-2019-0070740 | | 6/2019 | |
| KR | 10-1985606 | | 6/2019 | |
| KR | 10-2019-0098877 | | 8/2019 | |
| KR | 10-2047856 | | 11/2019 | |
| KR | 10-2020-0046222 | | 5/2020 | |
| KR | 10-2106817 | | 5/2020 | |
| KR | 10-2020-0101548 A | | 8/2020 | |
| KR | 10-2021-0100332 | | 8/2021 | |
| KR | 10-2295584 | | 8/2021 | |
| KR | 10-2021-0112290 | | 9/2021 | |
| KR | 10-2302803 | | 9/2021 | |
| KR | 10-2304665 | | 9/2021 | |
| KR | 10-2318418 | | 10/2021 | |
| KR | 10-2022-0051879 A | | 4/2022 | |
| WO | WO-2018207851 A1 | * | 11/2018 | G09F 9/30 |

* cited by examiner

DISPLAY APPARATUS INCLUDING PHASE RETARDATION AND PHASE COMPENSATION LAYERS

CROSS-REFERENCE TO RELATED APPLICATIONS

This application claims priority under 35 U.S.C. § 119 to and benefits of Korean Patent Application No. 10-2022-0059835, filed on May 16, 2022, and Korean Patent Application No. 10-2022-0094030, filed on Jul. 28, 2022, in the Korean Intellectual Property Office, the entire contents of which are incorporated herein by reference.

BACKGROUND

1. Technical Field

One or more embodiments relate to a display apparatus, and more particularly, to a display apparatus including a polarization film.

2. Description of the Related Art

A display apparatus is a device for displaying an image, and examples of a display apparatus include a liquid crystal display (LCD), an organic light-emitting display (OLED), and an electrophoretic display (EPD). Such a display apparatus includes a polarization film to prevent external light from being reflected from the display apparatus.

SUMMARY

One or more embodiments provide a display apparatus having excellent anti-reflection characteristics by forming a polarization film.

However, embodiments of the disclosure are not limited to those set forth herein. The above and other embodiments will become more apparent to one of ordinary skill in the art to which the disclosure pertains by referencing the detailed description of the disclosure given below.

According to one or more embodiments, a display apparatus may include a display panel including a display element and a thin-film encapsulation layer disposed on the display element, and a polarization film disposed on the display panel and including a polarization layer, a phase retardation layer, and a phase compensation layer, wherein a thickness direction phase difference $C_{Rth}$ of the phase compensation layer satisfies Equation: $C_{Rth}=-((Re\times sin^2(2\ominus)\times NZ)/2+A_{Rth})$, where Re is $(Ne-No)\times d$, $\ominus$ is an angle between a slow axis of the phase retardation layer and a transmission axis of the polarization layer, NZ is $(Nx-Nz)/(Nx-Ny)$, $A_{Rth}$ is a thickness direction phase difference of the display panel, Ne is an extraordinary refractive index of the phase retardation layer, No is an ordinary refractive index of the phase retardation layer, Nx is an x-direction refractive index of the phase retardation layer, Ny is a y-direction refractive index of the phase retardation layer, Nz is a z-direction refractive index of the phase retardation layer, and d is a thickness of the phase retardation layer.

The $\ominus$ may be in a range of about 350 to about 55°.

The Re may be in a range of about 132 nm to about 152 nm at a wavelength of 550 nm.

The $A_{Rth}$ may be in a range of about −60 nm to about +10 nm.

Re(550) at a wavelength of 550 nm and Re(450) at a wavelength of 450 nm may satisfy Equation: $0.8\leq Re(450)/Re(550)\leq 1$.

Re(650) at a wavelength of 650 nm and Re(550) at a wavelength of 550 nm may satisfy Equation: $1\leq Re(650)/Re(550)\leq 1.2$.

The phase compensation layer may be disposed on the display panel, the phase retardation layer may be disposed on the phase compensation layer, and the polarization layer may be disposed on the phase retardation layer.

The phase retardation layer may be disposed on the display panel, the phase compensation layer may be disposed on the phase retardation layer, and the polarization layer may be disposed on the phase compensation layer.

The thin-film encapsulation layer may include at least one inorganic encapsulation layer and at least one organic encapsulation layer.

The thin-film encapsulation layer may include a first inorganic encapsulation layer including at least one inorganic material and a second inorganic encapsulation layer including at least one inorganic material.

The display apparatus may further include a resin layer disposed on the thin-film encapsulation layer.

The display apparatus may further include an encapsulation substrate disposed on the thin-film encapsulation layer.

The display element may include a pixel electrode, an emission layer, and a counter electrode.

The display apparatus may further include a capping layer disposed on the counter electrode.

According to one or more embodiments, a display apparatus includes a substrate, a display element disposed on the substrate and including a pixel electrode, an emission layer, and a counter electrode, a capping layer disposed on the display element, a thin-film encapsulation layer disposed on the capping layer and including at least one inorganic encapsulation layer and at least one organic encapsulation layer, a resin layer disposed on the thin-film encapsulation layer, and a polarization film disposed on the resin layer and including a phase compensation layer, a phase retardation layer, and a polarization layer.

The thin-film encapsulation layer may include a first inorganic encapsulation layer including at least one inorganic material, an organic encapsulation layer, and a second inorganic encapsulation layer including at least one inorganic material.

The display apparatus may further include an encapsulation substrate disposed on the resin layer.

The phase compensation layer may be disposed on the resin layer, the phase retardation layer may be disposed on the phase compensation layer, and the polarization layer may be disposed on the phase retardation layer.

The phase retardation layer may be disposed on the resin layer, the phase compensation layer may be disposed on the phase retardation layer, and the polarization layer may be disposed on the phase compensation layer.

The polarization film may further include a first protective layer disposed on the polarization layer and a second protective layer disposed between the polarization layer and the phase retardation layer.

Other aspects, features, and advantages of the disclosure will become more apparent from the detailed description, the claims, and the drawings.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION OF THE EMBODIMENTS

Figure 1:
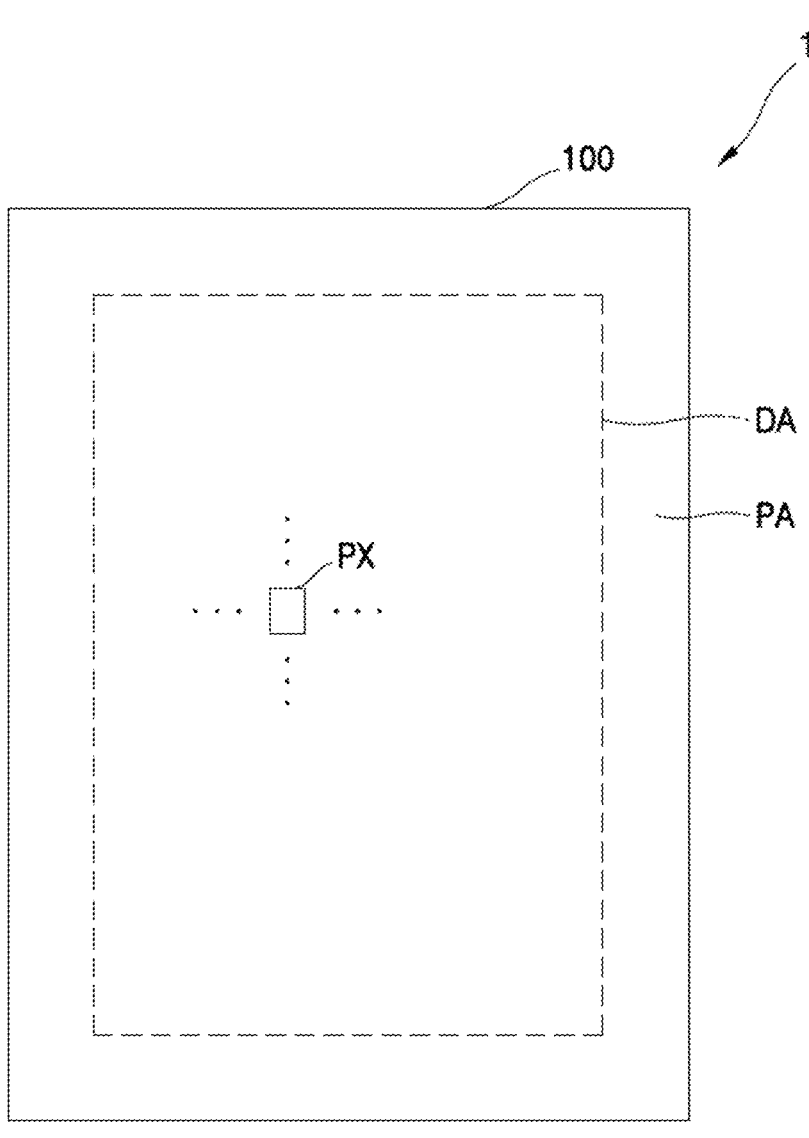
FIG. 1 is a schematic plan view illustrating a display apparatus according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the invention.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc., may be used to describe various types of elements, these elements should not be limited by these terms. These terms are only used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms "a," "an," and "the" are intended to include the plural forms as well, unless the context clearly indicates otherwise.

Moreover, the terms "comprises", "comprising", "includes," and/or "including," when used in this specification, when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

In the following embodiments, in case that a wiring "extends in a first direction or a second direction," it may mean that the wiring extends not only in a linear shape but also in a zigzag or curved shape in the first direction or the second direction.

In the following embodiments, "a plan view of an object" refers to "a view of an object seen from above, and "a cross-sectional view of an object" refers to "a view of an object vertically cut and seen from the side. In the following embodiments, in case that elements "overlap," it may mean that the elements overlap in a "plan view" and a "cross-sectional view".

Hereinafter, embodiments will be described in detail with reference to the accompanying drawings, wherein the same or corresponding elements are denoted by the same reference numerals throughout.

FIG. 1 is a schematic plan view illustrating a display apparatus according to an embodiment.

Referring to FIG. 1, a display apparatus 1 may include a display area DA and a peripheral area PA. For example, the display apparatus 1 may include a substrate 100. For example, the substrate 100 may include the display area DA and the peripheral area PA.

Pixels PX may be arranged in the display area DA of the substrate 100. Each pixel PX may include a display element such as an organic light-emitting diode. Each pixel PX may further include thin-film transistors and a storage capacitor for controlling the display element. The number of thin-film transistors included in each pixel PX may be changed in various ways. For example, first to seventh thin-film transistors may be included in each pixel PX.

Various wirings for applying electrical signals to the display area DA may be disposed in the peripheral area PA of the substrate 100. A thin-film transistor may be provided in the peripheral area PA. For example, the thin-film transistor disposed in the peripheral area PA may be a part of a circuit unit for controlling an electrical signal applied to the display area DA.

Although an organic light-emitting display apparatus is described as the display apparatus 1 according to an embodiment, embodiments are not limited thereto. For example, any of various types of display apparatuses 1 such as an inorganic electroluminescent (EL) display, an inorganic light-emitting display, or a quantum dot light-emitting display may be used.

Figure 2:
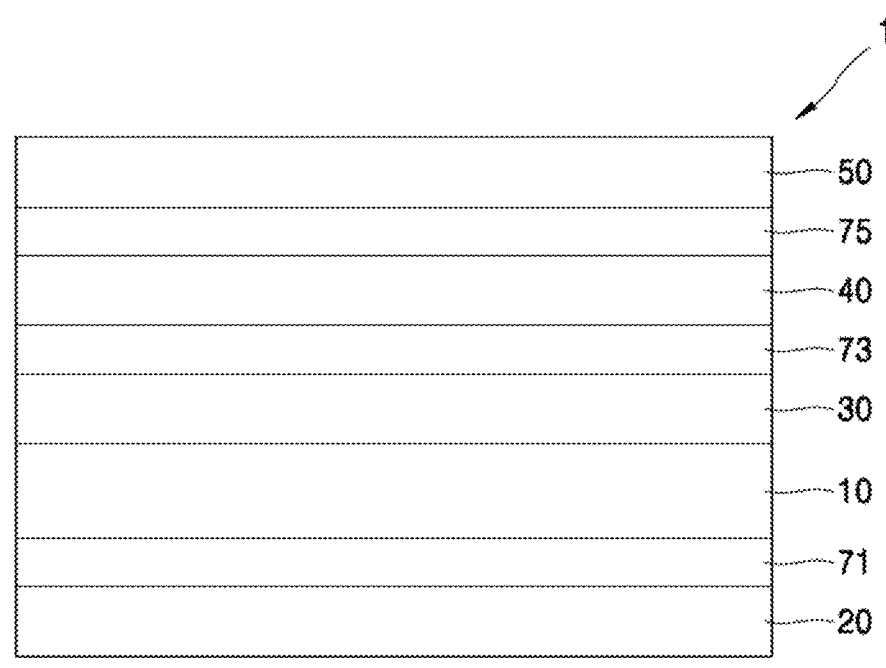
FIG. 2 is a schematic cross-sectional view illustrating a display apparatus according to an embodiment.

FIG. 2 is a schematic cross-sectional view illustrating a display apparatus according to an embodiment.

Referring to FIG. 2, the display apparatus 1 according to an embodiment may include a display panel 10, a cushion film 20, an input sensing layer 30, a polarization film 40, and a cover window 50.

The cushion film 20 may be disposed under the display panel 10. The cushion film 20 may protect the display panel 10 from external impact. A first adhesive layer 71 may be disposed between the display panel 10 and the cushion film 20. The first adhesive layer 71 may be a pressure sensitive adhesive (PSA).

The input sensing layer 30 may be disposed on the display panel 10. The input sensing layer 30 may obtain (or collect) coordinate information according to an external input, for example, a touch event. The input sensing layer 30 may include a sensing electrode (or a touch electrode) and trace lines (or signal wirings) connected to the sensing electrode. The input sensing layer 30 may be disposed (e.g., directly disposed) on the display panel 10. However, embodiments are not limited thereto.

The polarization film 40 may be disposed on the input sensing layer 30. The polarization film 40 will be described in more detail with reference to FIGS. 6 and 7.

A second adhesive layer 73 may be disposed between the polarization film 40 and the input sensing layer 30. The second adhesive layer 73 may be a pressure sensitive adhesive (PSA).

The cover window 50 may be disposed on the polarization film 40. The cover window 50 may protect the display panel 10, the input sensing layer 30, and the polarization film 40 disposed under the cover window 50. A third adhesive layer 75 may be disposed between the polarization film 40 and the cover window 50. The third adhesive layer 75 may be an optically clear adhesive (OCA).

Figure 3:
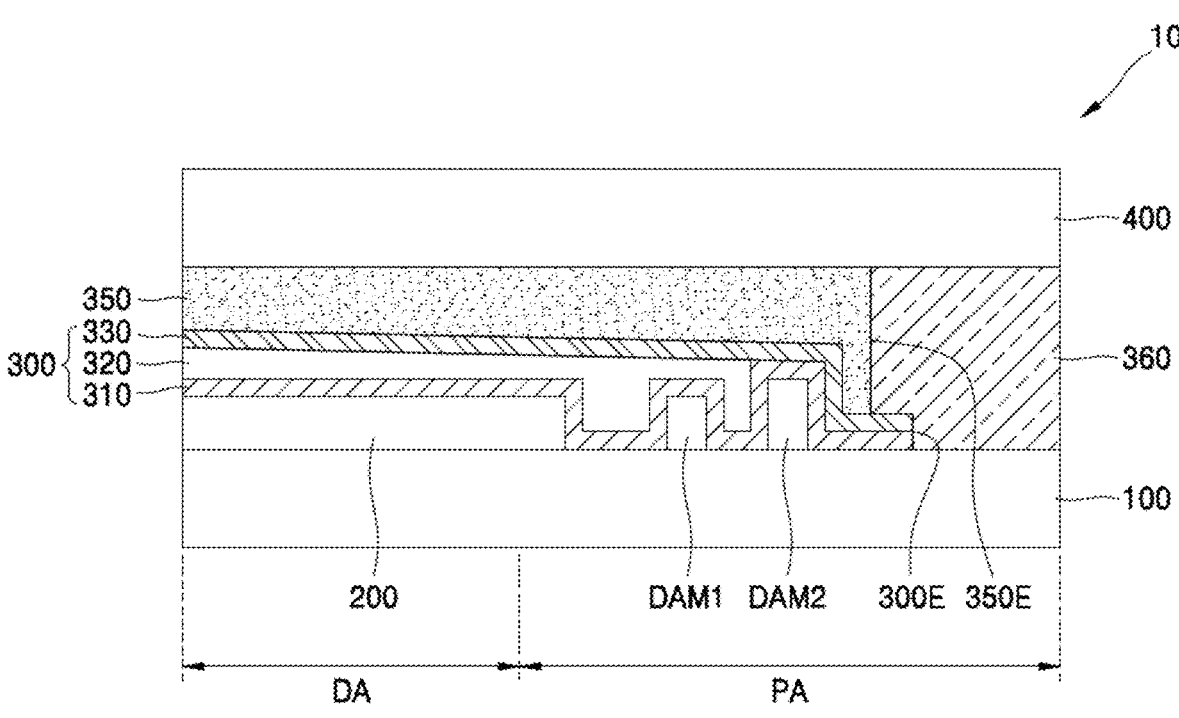
FIGS. 3 and 4 are schematic cross-sectional views illustrating a display apparatus according to an embodiment.
Figure 4:
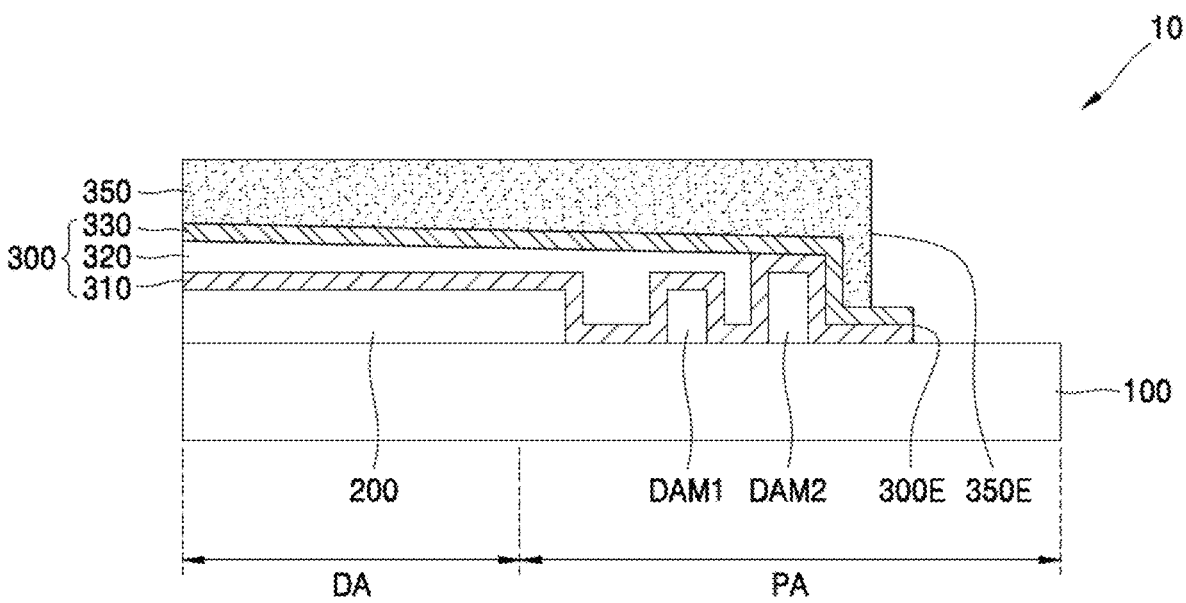

FIGS. 3 and 4 are schematic cross-sectional views illustrating a display apparatus according to an embodiment. FIGS. 3 and 4 are schematic cross-sectional views illustrating a part of the display panel 10 of the display apparatus 1.

Referring to FIG. 3, the display panel 10 may include the substrate 100, a display layer 200, a thin-film encapsulation layer 300, a resin layer 350, and a sealing member 360.

The substrate 100 may be formed of any of various materials such as a glass material, a metal material, or a plastic material. In an embodiment, the substrate 100 may be a flexible substrate. The substrate 100 may include a polymer resin such as polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP).

The display layer 200 may be disposed on the substrate 100. For example, the display layer 200 may refer to elements disposed between the substrate 100 and the thin-film encapsulation layer 300. The display layer 200 may include first and second thin-film transistors T1 and T2 and display elements 210, as described in more detail below with reference to FIG. 5.

A first dam DAM1 and a second dam DAM2 may be disposed on the substrate 100. The first dam DAM1 and the second dam DAM2 may be disposed in the peripheral area PA. For example, the first dam DAM1 and the second dam DAM2 may be arranged along a circumference of the display area DA. A height of the second dam DAM2 may be greater than a height of the first dam DAM1. Accordingly, a monomer (or a material) for forming the organic encapsulation layer 320 described below may be prevented from being lost (or overflowing) to the outside of the substrate 100. A height of the second dam DAM2 and a height of the first dam DAM1 may be heights in a thickness direction of the display panel 10.

The thin-film encapsulation layer 300 may be disposed on the display layer 200. The thin-film encapsulation layer 300 may include at least one inorganic encapsulation layer and at least one organic encapsulation layer. For example, the thin-film encapsulation layer 300 may include a first inorganic encapsulation layer 310, the organic encapsulation layer 320, and a second inorganic encapsulation layer 330 which are sequentially stacked.

The first inorganic encapsulation layer 310 may include at least one inorganic material. The first inorganic encapsulation layer 310 may include ceramic, metal oxide, metal nitride, metal carbide, metal oxynitride, indium oxide ($In_2O_3$), tin oxide ($SnO_2$), indium tin oxide (ITO), silicon oxide, silicon nitride, and/or silicon oxynitride. The first inorganic encapsulation layer 310 may have a single structure or a multi-layer structure.

The organic encapsulation layer 320 may include at least one material selected from the group consisting of acryl, methacrylic, polyester, polyethylene, polypropylene, polyethylene terephthalate (PET), polyethylene naphthalate (PEN), polycarbonate (PC), polyimide (PI), polyethylene sulfonate, polyoxymethylene, polyarylate, and hexamethyl-disiloxane (HMDSO).

The second inorganic encapsulation layer 330 may cover the organic encapsulation layer 320, and may include ceramic, metal oxide, metal nitride, metal carbide, metal oxynitride, indium oxide ($In_2O_3$), tin oxide ($SnO_2$), ITO, silicon oxide, silicon nitride, and/or silicon oxynitride. The second inorganic encapsulation layer 330 may have a single structure or a multi-layer structure. The second inorganic encapsulation layer 330 may prevent the organic encapsulation layer 320 from being exposed to the outside, by contacting the first inorganic encapsulation layer 310 at an edge portion disposed outside the display area DA.

As the thin-film encapsulation layer 300 includes the first inorganic encapsulation layer 310, the organic encapsulation layer 320, and the second inorganic encapsulation layer 330, in case that cracks occur in the thin-film encapsulation layer 300, due to the multi-layer structure, the cracks may not be connected between the first inorganic encapsulation layer 310 and the organic encapsulation layer 320 or between the organic encapsulation layer 320 and the second inorganic encapsulation layer 330. Accordingly, the formation of a path through which external moisture or oxygen penetrates into the display layer 200 may be prevented or minimized.

The resin layer 350 may be disposed on the thin-film encapsulation layer 300. The resin layer 350 may include a photocurable resin, for example, a UV-curable resin. The resin layer 350 may include an acrylic resin, for example, an acrylic ester-based material. The resin layer 350 may have a thickness that varies according to a region. For example, a thickness of a portion of the resin layer 350 corresponding to the display area DA may be less than a thickness of another portion of the resin layer 350 corresponding to the peripheral area PA.

An end portion of the resin layer 350 may be disposed at an inner position than an end portion of the thin-film encapsulation layer 300. For example, as shown in FIGS. 3 and 4, the resin layer 350 may be disposed at an inner position than an end portion 300E of the thin-film encapsulation layer 300. For example, the end portion 300E of the thin-film encapsulation layer 300 may protrude more than an end portion 350E of the resin layer 350 in a direction away from the display area DA.

An encapsulation substrate 400 may be disposed on the resin layer 350. The encapsulation substrate 400 may be formed of any of various materials such as a glass material, a metal material, or a plastic material. The sealing member 360 may be disposed outside the resin layer 350. The sealing member 360 may be disposed in the peripheral area PA of the display panel 10, and may be in contact with and coupled to a top surface (or upper surface) of the substrate 100 and a bottom surface (or lower surface) of the encapsulation substrate 400. As the sealing member 360 is disposed in the peripheral area PA, penetration (or permeation) of oxygen or moisture into the display layer 200 through a side surface of the display panel 10 may be prevented or minimized.

However, embodiments are not limited thereto. For example, as shown in FIG. 4, the encapsulation substrate 400 and the sealing member 360 may be omitted. For example, the input sensing layer 30 described with reference to FIG. 2 may be disposed on the resin layer 350.

Figure 5:
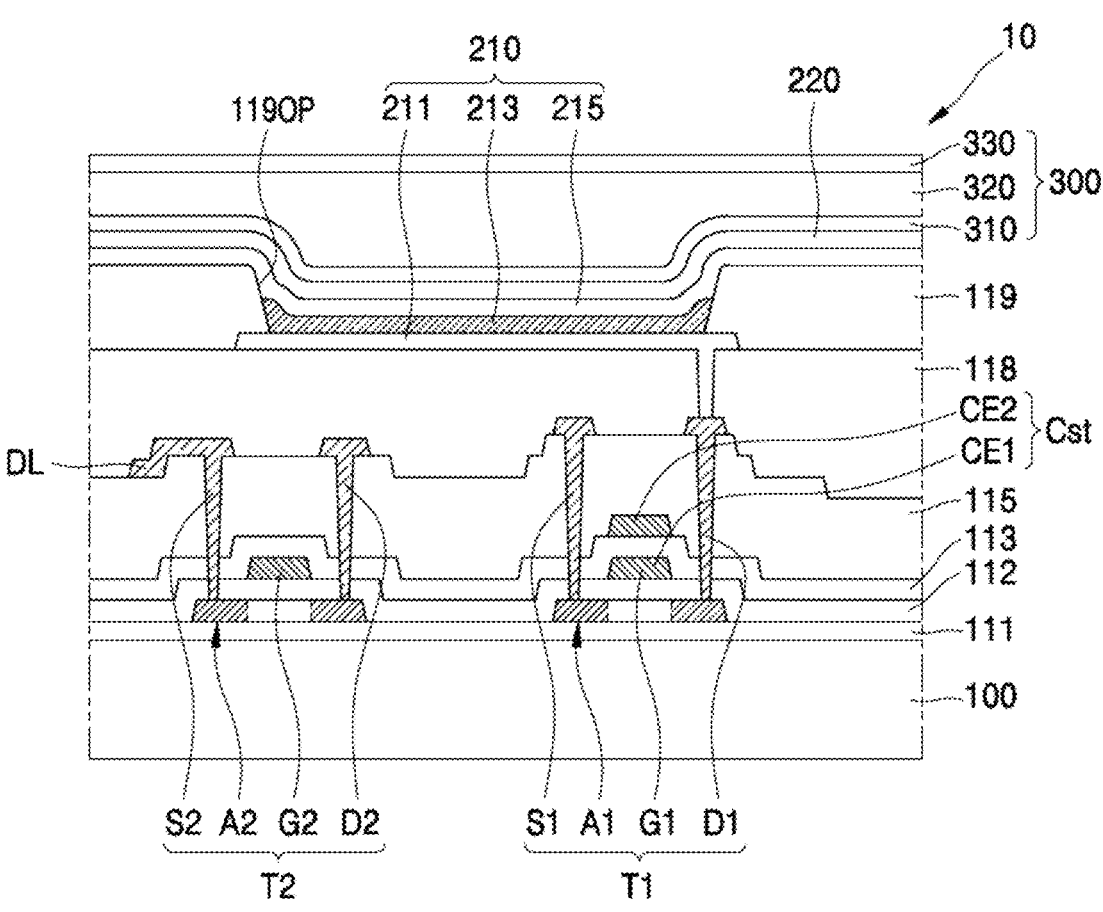
FIG. 5 is a schematic cross-sectional view illustrating a part of a display panel included in a display apparatus according to an embodiment.

FIG. 5 is a schematic cross-sectional view illustrating a part of a display panel included in a display apparatus according to an embodiment.

Referring to FIG. 5, the display panel 10 may include the first and second thin-film transistors T1 and T2 disposed on the substrate 100, and the display element 210 electrically connected to the first and second thin-film transistors T1 and T2. For example, the display panel 10 may further include various insulating layers (e.g., 111, 112, 113, 115, 118, and 119) and a storage capacitor Cst.

A buffer layer 111 may be disposed on the substrate 100, and may reduce or prevent penetration (or permeation) of a foreign material, moisture, or external air from the bottom surface (or lower surface) of the substrate 100 and may planarize the substrate 100. The buffer layer 111 may include an inorganic material such as oxide or nitride, an organic material, or a combination of an organic material and an inorganic material, and may have a single structure or a multi-layer structure including an inorganic material and an organic material. A barrier layer may be further provided between the substrate 100 and the buffer layer 111 to prevent penetration (or permeation) of external air. The buffer layer 111 may include silicon oxide ($SiO_2$) or silicon nitride ($SiN_x$).

The first thin-film transistor T1 and/or the second thin-film transistor T2 may be disposed on the buffer layer 111. The first thin-film transistor T1 may include a first semiconductor layer A1, a first gate electrode G1, a first source electrode S1, and a first drain electrode D1. The second thin-film transistor T2 may include a second semiconductor layer A2, a second gate electrode G2, a second source electrode S2, and a second drain electrode D2. The first thin-film transistor T1 may be connected to the display element 210 and may function as a driving thin-film transistor for driving the display element 210. The second thin-film transistor T2 may be connected to a data line DL and may function as a switching thin-film transistor. Although two thin-film transistors are illustrated in FIG. 5, embodiments are not limited thereto. The number of thin-film transistors may be changed in various ways. For example, first to seventh thin-film transistors may be provided.

Each of the first semiconductor layer A1 and the second semiconductor layer A2 may include amorphous silicon or polycrystalline silicon. In another example, each of the first semiconductor layer A1 and the second semiconductor layer A2 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). Each of the first semiconductor layer A1 and the second semiconductor layer A2 may include a channel region, and a source region and a drain region doped with impurities.

The first gate electrode G1 and the second gate electrode G2 may be respectively disposed on the first semiconductor layer A1 and the second semiconductor layer A2 with a first gate insulating layer 112 therebetween. Each of the first gate electrode G1 and the second gate electrode G2 may include molybdenum (Mo), aluminum (Al), copper (Cu), or titanium (Ti), and may have a single structure or a multi-layer structure. For example, each of the first gate electrode G1 and the second gate electrode G2 may have a single-layer structure including Mo.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second gate insulating layer 113 may cover the first gate electrode G1 and the second gate electrode G2. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A first storage electrode CE1 of the storage capacitor Cst may overlap the first thin-film transistor T1. For example, the first gate electrode G1 of the first thin-film transistor T1 may function as the first storage electrode CE1 of the storage capacitor Cst. However, embodiments are not limited thereto. The storage capacitor Cst may not overlap the first thin-film transistor T1 and may be spaced apart from the first thin-film transistor T1.

A second storage electrode CE2 of the storage capacitor Cst may overlap the first storage electrode CE1 with the second gate insulating layer 113 therebetween. For example, the second gate insulating layer 113 may function as a dielectric layer of the storage capacitor Cst. The second storage electrode CE2 may include a conductive material including molybdenum (Mo), aluminum (Al), copper (Cu), or titanium (Ti), and may have a single structure or a multi-layer structure including the above material. For example, the second storage electrode CE2 may have a single-layer structure including Mo or a multi-layer structure including Mo/Al/Mo.

An interlayer insulating layer 115 may be formed over an entire surface of the substrate 100 to cover the second storage electrode CE2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The first source electrode S1, the second source electrode S2, the first drain electrode D1, and the second drain electrode D2 may be disposed on the interlayer insulating layer 115. Each of the first source electrode S1, the second source electrode S2, the first drain electrode D1, and the second drain electrode D2 may include a conductive material including molybdenum (Mo), aluminum (Al), copper (Cu), or titanium (Ti), and may have a single structure or a multi-layer structure including the above material. For example, each of the first source electrode S1, the second source electrode S2, the first drain electrode D1, and the second drain electrode D2 may have a multi-layer structure including Ti/Al/Ti.

A planarization layer 118 may be disposed on the first source electrode S1, the second source electrode S2, the first drain electrode D1, and the second drain electrode D2, and the display element 210 may be disposed on the planarization layer 118. The display element 210 may include a pixel electrode 211, an emission layer 213, and a counter electrode 215.

The planarization layer 118 may have a flat top surface (or flat upper surface) to planarize the pixel electrode 211. The planarization layer 118 may have a single structure or a multi-layer structure including an organic material or an inorganic material. The planarization layer 118 may include benzocyclobutene (BCB), polyimide, hexamethyldisiloxane (HMDSO), a general-purpose polymer such as polymethyl methacrylate (PMMA) or polystyrene (PS), a polymer derivative having a phenol-based group, an acrylic polymer, an imide-based polymer, an aryl ether-based polymer, an amide-based polymer, a fluorinated polymer, a p-xylene-based polymer, a vinyl alcohol-based polymer, or a compound thereof. In another example, the planarization layer 118 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). After the planarization layer 118 is formed, chemical mechanical polishing may be performed to provide a flat top surface (or flat upper surface).

An opening through which any one of the first source electrode S1 and the first drain electrode D1 of the first thin-film transistor T1 is exposed may be formed in the planarization layer 118, and the pixel electrode 211 may contact the first source electrode S1 or the first drain electrode D1 through the opening to be electrically connected to the first thin-film transistor T1.

The pixel electrode 211 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 211 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, the pixel electrode 211 may further include a film formed of ITO, IZO, ZnO, or $In_2O_3$ over/under the above reflective film. For example, the pixel electrode 211 may have a multi-layer structure including ITO/Ag/ITO.

A pixel-defining film 119 may be disposed on the pixel electrode 211. The pixel-defining film 119 defines a pixel by having an opening 1190P corresponding to each pixel, e.g., an opening 1190P through which at least a central portion of the pixel electrode 211 is exposed. For example, the pixel-defining film 119 may increase a distance between an edge portion of the pixel electrode 211 and the counter electrode 215, thereby preventing an arc or the like from occurring between the edge portion of the pixel electrode 211 and the counter electrode 215. The pixel-defining film 119 may be formed of an organic material such as polyimide (PI) or hexamethyldisiloxane (HMDSO).

A spacer may be disposed on the pixel-defining film 119. The spacer may be used to protect a mask from damage which is occurred in a mask process. The spacer may be formed of an organic material such as polyimide (PI) or hexamethyldisiloxane (HMDSO). The spacer and the pixel-defining film 119 may be simultaneously formed of the same material. For example, a halftone mask may be used.

The emission layer 213 of the display element 210 may include an organic material including a fluorescent or phosphorescent material that emits red light, green light, blue light, or white light. The emission layer 213 may be formed of a low molecular weight organic material or a high molecular weight organic material, and functional layers such as a hole transport layer (HTL), a hole injection layer (HIL), an electron transport layer (ETL), and an electron injection layer (EIL) may be selectively disposed under and over the emission layer 213. The emission layer 213 may be disposed to overlap each of pixel electrodes 211. However, embodiments are not limited thereto. Various modifications may be made. For example, the emission layer 213 may include an integral layer over the pixel electrodes 211.

The counter electrode 215 may be a light-transmitting electrode or a reflective electrode. In another example, the counter electrode 215 may be a transparent or semi-transparent electrode, and may include a thin metal film having a low work function including ytterbium (Yb), lithium (Li), calcium (Ca), LiF/Ca, LiF/Al, aluminum (Al), silver (Ag), magnesium (Mg), or a compound thereof. For example, a transparent conductive oxide (TCO) film such as ITO, IZO, ZnO, or $In_2O_3$ may be further disposed on the thin metal film. The counter electrode 215 may be disposed over the display area DA and the peripheral area PA, and may be disposed on the emission layer 213 and the pixel-defining film 119. The counter electrode 215 may be integral with display elements 210 to overlap pixel electrodes 211.

A capping layer 220 may be disposed on the display element 210. For example, the capping layer 220 may be disposed on the counter electrode 215. The capping layer 220 may include an organic material and/or an inorganic material. In case that the capping layer 220 includes an organic material, the capping layer 220 may include α-NPD, NPB, TPD, m-MTDATA, $Alq_3$, CuPc, N4,N4,N4',N4'-tetra (biphenyl-4-yl) biphenyl-4,4'-diamine (TPD15), or 4,4',4"-Tris (carbazol sol-9-yl) triphenylamine (TCTA), or may include epoxy resin or acrylate such as methacrylate. In another example, in case that the capping layer 220 includes an inorganic material, the capping layer 220 may include an alkali metal compound such as LiF, an alkaline earth metal compound such as $MgF_2$, silicon oxide ($SiO_2$), silicon nitride ($SiN_x$), or silicon oxynitride (SiON). The capping layer 220 may have a single structure or a multi-layer structure. As the capping layer 220 is provided on the display element 210, the efficiency of light emitted from the display element 210 may be improved.

The thin-film encapsulation layer 300 may be disposed on the capping layer 220. As described with reference to FIG. 3, the thin-film encapsulation layer 300 may include at least one inorganic encapsulation layer and at least one organic encapsulation layer. For example, the thin-film encapsulation layer 300 may include the first inorganic encapsulation layer 310, the organic encapsulation layer 320, and the second inorganic encapsulation layer 330 which are sequentially stacked. Each of the first inorganic encapsulation layer 310 and the second inorganic encapsulation layer 330 may have a single structure or a multi-layer structure.

Figure 6:
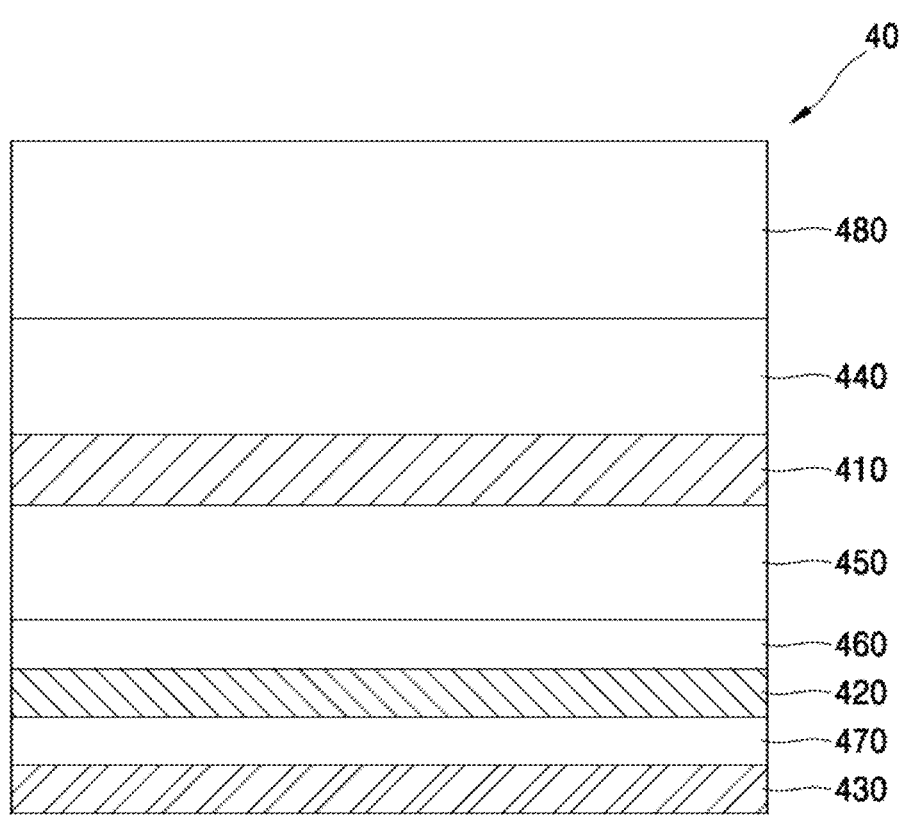
FIGS. 6 and 7 are schematic cross-sectional views illustrating a part of a polarization film included in a display apparatus according to an embodiment.
Figure 7:
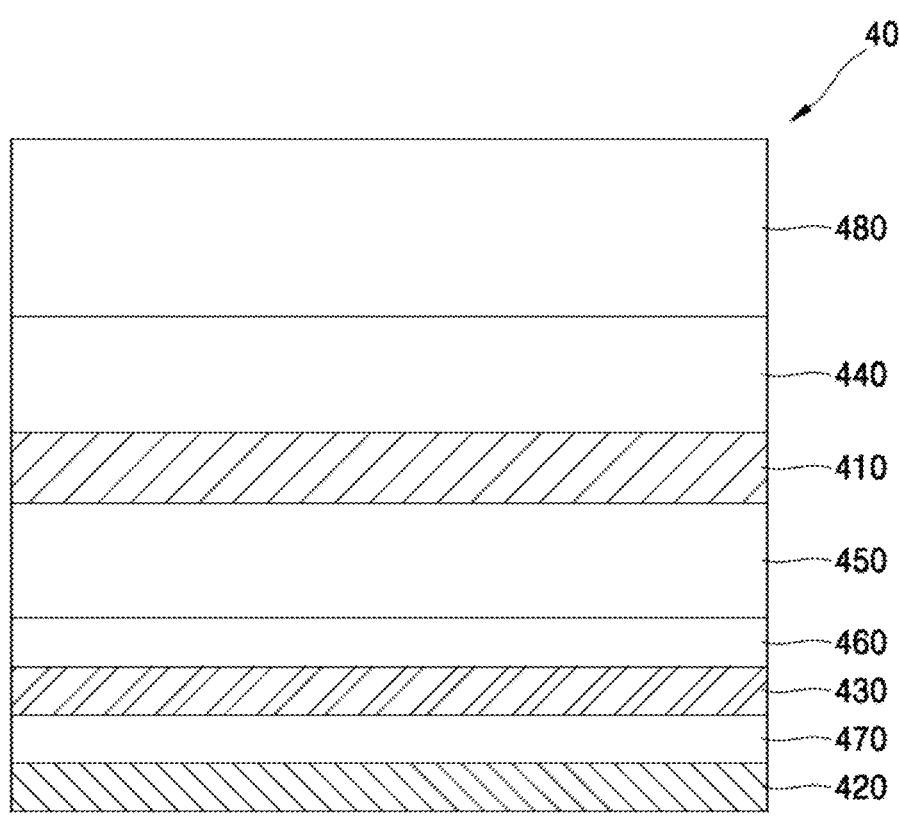

FIGS. 6 and 7 are schematic cross-sectional views illustrating a part of a polarization film included in a display apparatus according to an embodiment.

Referring to FIGS. 6 and 7, the polarization film 40 according to an embodiment may include a polarization layer 410, a phase retardation layer 420, a phase compensation layer 430, a first protective layer 440, and a second protective layer 450.

In an embodiment, the polarization layer 410 may polarize light incident from a light source into light of the same direction as a polarization axis. The polarization layer 410 may include a polarizer and/or a dichroic dye in a polyvinyl alcohol (PVA) film. The dichroic dye may be iodine molecules and/or dye molecules. In another example, the polarization layer 410 may be formed by stretching a polyvinyl alcohol (PVA) film in a direction and immersing the polyvinyl alcohol (PVA) film in a solution of iodine and/or dichroic dye. For example, iodine molecules and/or dichroic dye molecules may be arranged in a direction parallel to a stretching direction. As the iodine molecules and the dye molecules has dichroism character, the iodine molecules and the dye molecules may absorb light vibrating in the stretching direction and may transmit light vibrating in a direction perpendicular to the stretching direction.

The phase retardation layer 420 may be disposed under the polarization layer 410. The phase retardation layer 420 may delay a phase of light polarized through the polarization layer 410. Light passing through the phase retardation layer 420 may be converted into circularly polarized light or elliptically polarized light. Accordingly, a reflectance of light may be reduced. The phase retardation layer 420 may be disposed farther from a light source than the polarization layer 410. For example, in case that external light is incident on the polarization layer 410, the phase retardation layer 420 may be disposed under the polarization layer 410.

The phase retardation layer 420 may be a positive A plate. However, embodiments are not limited thereto. The phase retardation layer 420 may be one of a negative A plate, a positive C plate, or a negative C plate. The phase retardation layer 420 may be a quarter-wave plate (QWP). The phase retardation layer 420 may include at least one of polycarbonate (PC), tri-acetyl cellulose (TAC), and cyclo-olefin polymer.

The phase compensation layer 430 may be disposed under the phase retardation layer 420. The phase compensation layer 430 may be a positive C plate. However, embodiments are not limited thereto. The phase compensation layer 430 may be one of a positive A plate, a negative A plate, or a negative C plate. The phase compensation layer 430 may include at least one of polycarbonate (PC), tri-acetyl cellulose (TAC), and cyclo-olefin polymer.

The first protective layer 440 and the second protective layer 450 may be respectively disposed on a top surface (or upper surface) and a bottom surface (or lower surface) of the polarization layer 410. The first protective layer 440 and the second protective layer 450 may support the polarization layer 410 and may improve the mechanical strength of the polarization layer 410. Each of the first protective layer 440 and the second protective layer 450 may include tri-acetyl cellulose (TAC), cyclo-olefin polymer, polymethyl methacrylate (PMMA), or polyethylene terephthalate (PET).

A fourth adhesive layer 460 may be disposed between the second protective layer 450 and the phase retardation layer 420. The fourth adhesive layer 460 may be used to attach the phase retardation layer 420 to the bottom surface (or lower surface) of the second protective layer 450. The fourth adhesive layer 460 may be a pressure sensitive adhesive (PSA). For example, the fourth adhesive layer 460 may be an acrylic pressure sensitive adhesive (PSA).

A fifth adhesive layer 470 may be disposed between the phase retardation layer 420 and the phase compensation layer 430. The fifth adhesive layer 470 may be used to attach the phase compensation layer 430 to the bottom surface (or lower surface) of the phase retardation layer 420. The fifth adhesive layer 470 may be a pressure sensitive adhesive (PSA). For example, the fifth adhesive layer 470 may be an acrylic pressure sensitive adhesive (PSA).

In an embodiment, the polarization film 40 may include the phase compensation layer 430, the phase retardation layer 420, and the polarization layer 410. For example, as shown in FIG. 6, the phase retardation layer 420 may be disposed on the phase compensation layer 430, and the polarization layer 410 may be disposed on the phase retardation layer 420. However, as described above, the fifth adhesive layer 470 may be disposed between the phase compensation layer 430 and the phase retardation layer 420, and the fourth adhesive layer 460 and the second protective layer 450 may be provided between the phase retardation layer 420 and the polarization layer 410.

As shown in FIG. 7, the phase compensation layer 430 may be disposed on the phase retardation layer 420, and the polarization layer 410 may be disposed on the phase compensation layer 430. For example, the fifth adhesive layer 470 may be provided between the phase retardation layer 420 and the phase compensation layer 430, and the fourth adhesive layer 460 and the second protective layer 450 may be provided between the phase compensation layer 430 and the polarization layer 410.

A sixth adhesive layer 480 may be disposed on the first protective layer 440. The sixth adhesive layer 480 may be used to attach the polarization film 40 to the cover window 50 (see FIG. 2). The sixth adhesive layer 480 may include a photocurable resin, for example, a UV-curable resin. The sixth adhesive layer 480 may include an acrylic resin, for example, an acrylic ester-based material. After the sixth adhesive layer 480 is formed or disposed on the first protective layer 440, the sixth adhesive layer 480 may be cured (e.g., UV-cured).

The capping layer 220 (see FIG. 5), the thin-film encapsulation layer 300 (see FIG. 5), and the resin layer 350 (see FIG. 3) may be disposed on the display element 210 (see FIG. 5). The thin-film encapsulation layer 300 may include the first inorganic encapsulation layer 310, the organic encapsulation layer 320, and the second inorganic encapsulation layer 330. For example, each of the capping layer 220, the first inorganic encapsulation layer 310, and the second inorganic encapsulation layer 330 may include layers having different refractive indices.

Accordingly, layers having different refractive indices may be provided between the substrate 100 and the polarization film 40. For example, a phase shift of external light incident on a side surface may occur due to the capping layer 220, the first inorganic encapsulation layer 310, the organic encapsulation layer 320, the second inorganic encapsulation layer 330, and the resin layer 350, which cause light leakage or increase a reflectance. Accordingly, a phase shift of external light incident on a side surface (or external light incident on the display apparatus) may be compensated.

In an embodiment, the polarization film 40 may be disposed on the display panel 10, and the polarization film 40 may include the phase compensation layer 430, the phase retardation layer 420, and the polarization layer 410. For example, a thickness direction phase difference $C_{Rth}$ of the phase compensation layer 430 may satisfy Equation: $C_{Rth} = -((Re \times \sin^2(2\ominus) \times NZ)/2 + A_{Rth})$.

Re is $(Ne-No) \times d$, $\ominus$ is an angle between a slow axis of the phase retardation layer 420 and a transmission axis of the polarization layer 410, NZ is $(Nx-Nz)/(Nx-Ny)$, $A_{Rth}$ is a thickness direction phase difference of the display panel 10, Ne is an extraordinary refractive index of the phase retardation layer 420, No is an ordinary refractive index of the phase retardation layer 420, Nx is an x-direction refractive index of the phase retardation layer 420, Ny is a y-direction refractive index of the phase retardation layer 420, Nz is a z-direction refractive index of the phase retardation layer 420, and d is a thickness of the phase retardation layer 420.

Re is an in-plane phase difference of the phase retardation layer 420, and may have a value in a range of about 132 nm to about 152 nm at a wavelength of 550 nm. For example, Re(550) at a wavelength of 550 nm and Re(450) at a wavelength of 450 nm may satisfy Equation: $0.8 \leq Re(450)/Re(550) \leq 1$. Re(650) at a wavelength of 650 nm and Re(550) at a wavelength of 550 nm may satisfy Equation: $1 \leq Re(650)/Re(550) \leq 1.2$.

$\ominus$ is an angle between a slow axis of the phase retardation layer 420 and a transmission axis of the polarization layer 410, and may have a value in a range of about 350 to about 55°. NZ is $(Nx-Nz)/(Nx-Ny)$, and may refer to a degree of biaxiality of the phase retardation layer 420. For example, $A_{Rth}$ is a thickness direction phase difference of the display panel 10, and may have a value in a range of about −60 nm to about +10 nm. In another example, $A_{Rth}$ is a thickness direction phase difference of the display panel 10, and may have a value in a range of about −60 nm to about 0 nm.

In an embodiment, in case that the polarization film 40 is disposed on the display panel 10, the polarization film 40 may include the phase compensation layer 430, and the thickness direction phase difference $C_{Rth}$ of the phase compensation layer 430 satisfies the above equation, a phase shift of external light incident on a side surface may be compensated, and thus, light leakage may be prevented and a reflectance of external light may decrease.

Table 1 shows various samples in which the display panel 10 includes layers having different refractive indices. In Table 1, n denotes a refractive index and t denotes a thickness. For example, the unit of t is angstrom (Å). In Table 1, $A_{Rth}$ corresponds to a thickness direction phase difference of the display panel 10 at a wavelength of 550 nm, and $C_{Rth}$ corresponds to a thickness direction phase difference of the phase compensation layer 430 in case that a value of $((Re \times \sin^2(2\ominus) \times NZ)/2)$ is 70.5 nm. For example, $C_{Rth}$ corresponds to a compensation value for compensating a phase shift of external light incident on a side surface.

TABLE 1

| sample | Counter electrode (215) | | Capping layer (220) | | | | SiOx | | Thin-film encapsulation layer (300) | | | | | | | | A_Rh | C_Rh |
| | Yb | AgMg | CPL | | LIF | | | | SiON | | SiON | | SiOx | | SiOx | | | |
| | t | t | n | t | n | t | n | t | n | t | n | t | n | t | n | t | (nm) | (nm) |
|---|---|---|---|---|---|---|---|---|---|---|---|---|---|---|---|---|---|---|
| #1 | 13 | 95 | 2 | 950 | 1.4 | 400 | — | — | 1.89 | 1350 | 1.62 | 9000 | 1.57 | 800 | — | — | 0.1 | −70.6 |
| #2 | 13 | 105 | 2 | 640 | — | — | — | — | 1.77 | 10000 | 1.62 | 700 | — | — | — | — | −55.1 | −15.4 |
| #3 | 13 | 105 | 2 | 640 | — | — | 1.57 | 1200 | 1.77 | 10000 | 1.62 | 700 | — | — | — | — | −36.3 | −34.2 |
| #4 | 13 | 95 | 2 | 1000 | 1.4 | 400 | — | — | 1.89 | 1350 | 1.77 | 9000 | 1.62 | 700 | — | — | −0.2 | −70.3 |
| #5 | 13 | 95 | 2 | 1000 | 1.4 | 400 | — | — | 1.89 | 1250 | 1.77 | 9000 | 1.62 | 700 | — | — | −7.1 | −63.4 |
| #6 | 13 | 95 | 2 | 750 | — | — | 1.52 | 600 | 1.89 | 1350 | 1.62 | 9000 | 1.57 | 700 | — | — | −41.8 | −28.7 |
| #7 | 13 | 95 | 2 | 850 | — | — | 1.52 | 600 | 1.89 | 1350 | 1.62 | 9000 | 1.57 | 700 | — | — | −43.0 | −27.5 |
| #8 | 13 | 95 | 2 | 950 | — | — | 1.52 | 600 | 1.89 | 1350 | 1.62 | 9000 | 1.57 | 700 | — | — | −40.6 | −29.9 |
| #9 | 13 | 105 | 2 | 850 | — | — | 1.52 | 600 | 1.89 | 1350 | 1.62 | 9000 | 1.57 | 700 | — | — | −44.0 | −26.5 |
| #10 | 13 | 95 | 2 | 850 | — | — | 1.52 | 800 | 1.89 | 1350 | 1.62 | 9000 | 1.57 | 700 | — | — | −38.8 | −31.7 |
| #11 | 13 | 105 | 2 | 800 | — | — | 1.52 | 800 | 1.89 | 1350 | 1.62 | 9000 | 1.57 | 700 | — | — | −48.0 | −22.5 |
| #12 | 13 | 95 | 2 | 850 | — | — | 1.57 | 800 | 1.89 | 1350 | 1.62 | 9000 | 1.57 | 700 | — | — | −45.3 | −25.2 |
| #13 | 13 | 105 | 2 | 800 | — | — | 1.57 | 800 | 1.89 | 1350 | 1.62 | 9000 | 1.57 | 700 | — | — | −31.2 | −39.3 |
| #14 | 13 | 105 | 2 | 900 | — | — | 1.57 | 800 | 1.89 | 1350 | 1.62 | 9000 | 1.57 | 700 | — | — | −34.8 | −35.7 |
| #15 | 13 | 95 | 2 | 750 | — | — | 1.5 | 600 | 1.89 | 1350 | 1.62 | 9000 | 1.57 | 800 | 1.48 | 800 | −29.8 | −40.7 |
| #16 | 13 | 95 | 2 | 650 | — | — | 1.5 | 600 | 1.89 | 1350 | 1.62 | 9000 | 1.57 | 800 | 1.48 | 800 | −29.3 | −41.2 |
| #17 | 13 | 95 | 2 | 850 | — | — | 1.5 | 600 | 1.89 | 1350 | 1.62 | 9000 | 1.57 | 800 | 1.48 | 800 | −29.2 | −41.3 |
| #18 | 13 | 95 | 2 | 950 | — | — | 1.5 | 600 | 1.89 | 1350 | 1.62 | 9000 | 1.57 | 800 | 1.48 | 800 | −35.2 | −35.3 |
| #19 | 13 | 100 | 1.9 | 830 | 1.4 | 200 | — | — | 1.77 | 10500 | — | — | — | — | — | — | −55.0 | −15.5 |
| #20 | 13 | 100 | 1.9 | 830 | 1.4 | 200 | — | — | 1.77 | 10500 | — | — | — | — | — | — | −56.0 | −14.5 |
| #21 | 13 | 100 | 1.9 | 830 | — | — | — | — | 1.89 | 10000 | — | — | — | — | — | — | −45.2 | −25.3 |
| #22 | 13 | 115 | 2 | 950 | 1.4 | 400 | — | — | 1.89 | 1350 | 1.62 | 9000 | 1.57 | 800 | — | — | 3.5 | −74.0 |
| #23 | 13 | 95 | 2 | 950 | 1.4 | 400 | — | — | 1.89 | 1350 | 1.62 | 9000 | 1.57 | 800 | — | — | 5.1 | −75.6 |
| #24 | 13 | 105 | 2 | 1000 | 1.4 | 400 | — | — | 1.89 | 1350 | 1.62 | 9000 | 1.57 | 800 | — | — | 0.0 | −70.5 |
| #25 | 13 | 105 | 2 | 900 | 1.4 | 400 | — | — | 1.89 | 1350 | 1.62 | 9000 | 1.57 | 800 | — | — | 0.1 | −70.6 |
| #26 | 13 | 95 | 2 | 750 | — | — | 1.5 | 600 | 1.89 | 1350 | 1.77 | 9000 | 1.62 | 800 | — | — | −27.6 | −42.9 |
| #27 | 13 | 95 | 2 | 850 | — | — | 1.5 | 600 | 1.89 | 1350 | 1.77 | 9000 | 1.62 | 800 | — | — | −30.6 | −39.9 |
| #28 | 13 | 95 | 2 | 950 | — | — | 1.5 | 600 | 1.89 | 1350 | 1.77 | 9000 | 1.62 | 800 | — | — | −34.6 | −35.9 |
| #29 | 13 | 95 | 1.9 | 620 | — | — | 1.5 | 600 | 1.89 | 9000 | 1.7 | 700 | — | — | — | — | −39.4 | −31.1 |

Referring to Table 1, in case that the display panel 10 includes layers having different refractive indices, the thickness direction phase difference $A_{Rth}$ of the display panel 10 may be changed. For example, referring to sample #1 and sample #29, the thickness direction phase difference $A_{Rth}$ of the display panel 10 may vary according to refractive indices and thicknesses of layers provided between the counter electrode 215 and the polarization film 40.

Figure 8:
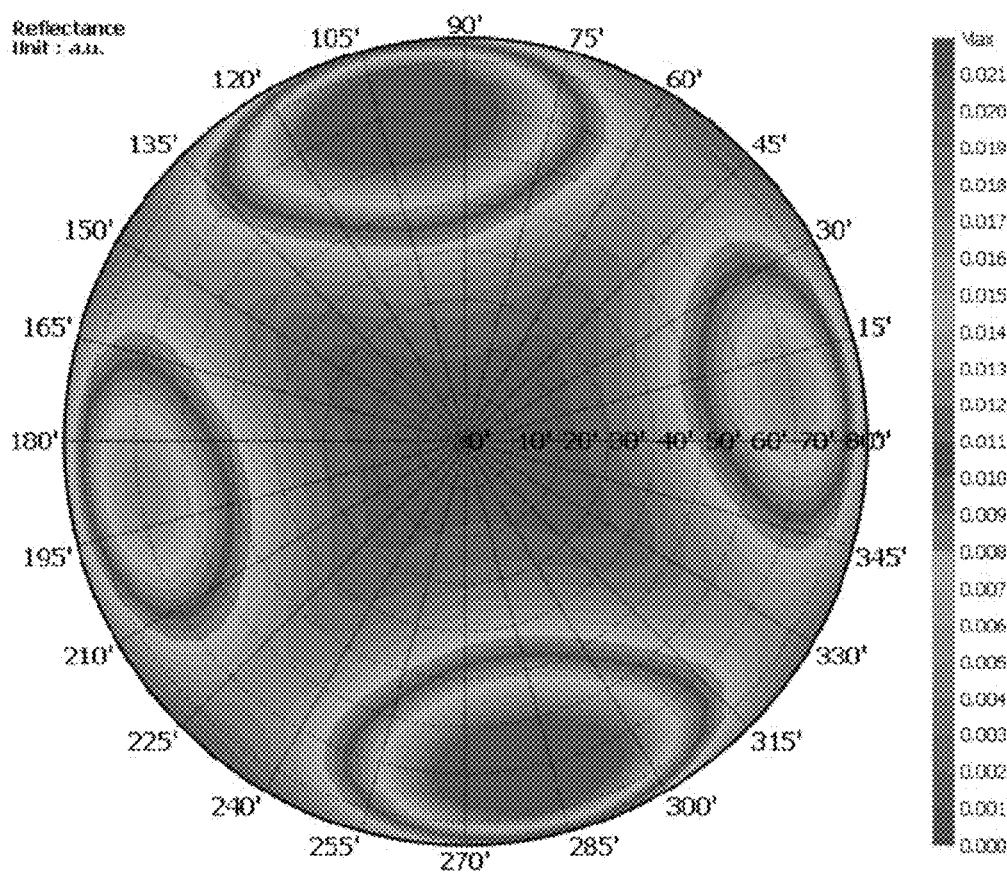
FIG. 8 illustrates a reflectance of sample #1 in case that a polarization film does not include a phase compensation layer.
Figure 9:
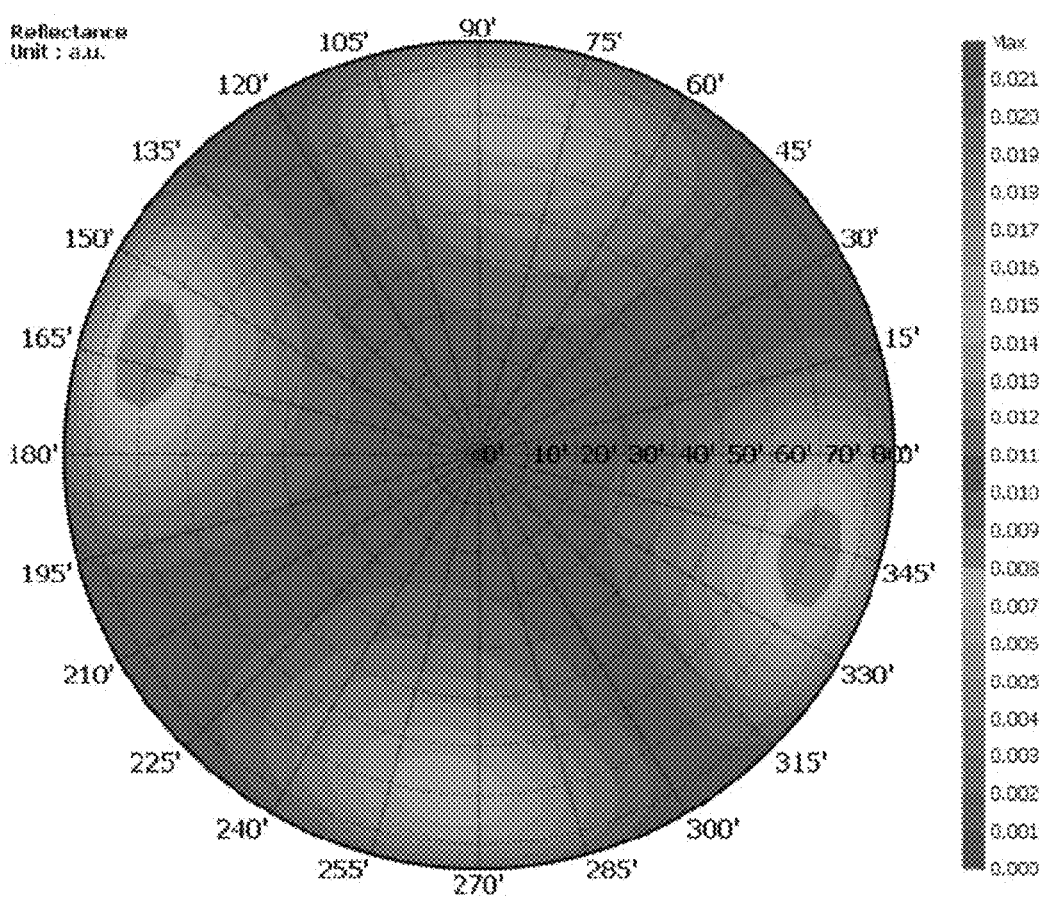
FIG. 9 illustrates a reflectance of sample #1 in case that a polarization film includes a phase compensation layer.

FIG. 8 illustrates a reflectance of sample #1 in case that a polarization film does not include a phase compensation layer. FIG. 9 illustrates a reflectance of sample #1 in case that a polarization film includes a phase compensation layer. For example, FIG. 8 illustrates a reflectance in case that a thickness direction phase difference for sample #1 is not compensated. FIG. 9 illustrates a reflectance in case that a thickness direction phase difference for sample #1 is compensated. For example, FIG. 9 corresponds to a case where −70.6 nm that is the thickness direction phase difference $C_{Rth}$ of the phase compensation layer 430 for sample #1 is compensated. FIG. 8 corresponds to a case where the thickness direction phase difference for sample #1 is not compensated.

Referring to FIGS. 8 and 9, in case that the polarization film 40 includes the phase compensation layer 430 and the thickness direction phase difference $C_{Rth}$ of the phase compensation layer 430 satisfies the above equation, a reflectance of sample #1 may be reduced, compared to a case where the polarization film 40 does not include the phase compensation layer 430. For example, in case that the polarization film 40 includes the phase compensation layer 430 and the thickness direction phase difference $C_{Rth}$ of the phase compensation layer 430 satisfies the above equation, a reflectance of light incident on a side surface of the display apparatus 1 may be reduced, compared to a case where the polarization film 40 does not include the phase compensation layer 430.

Figure 10:
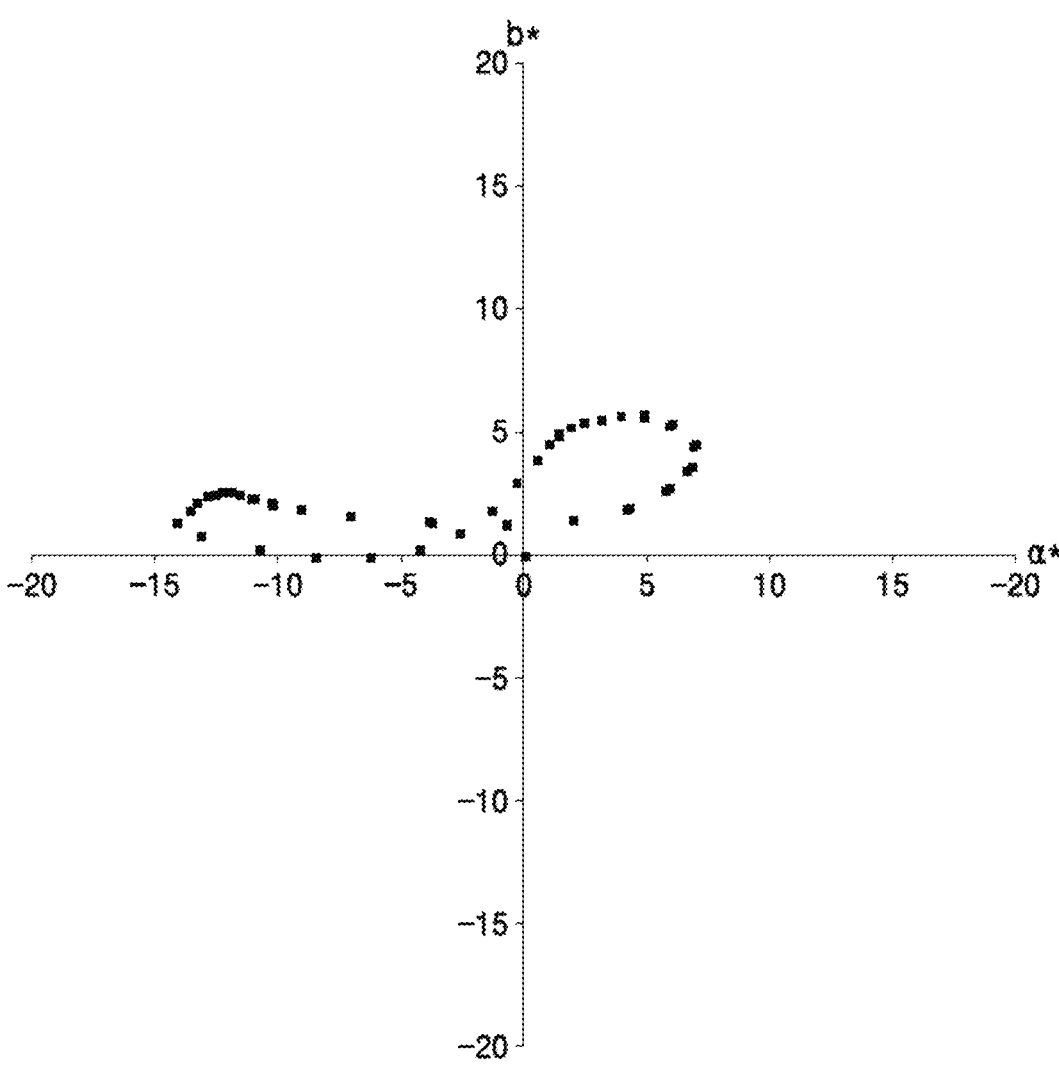
FIG. 10 illustrates a reflection color deviation for sample #1 in case that a polarization film does not include a phase compensation layer.
Figure 11:
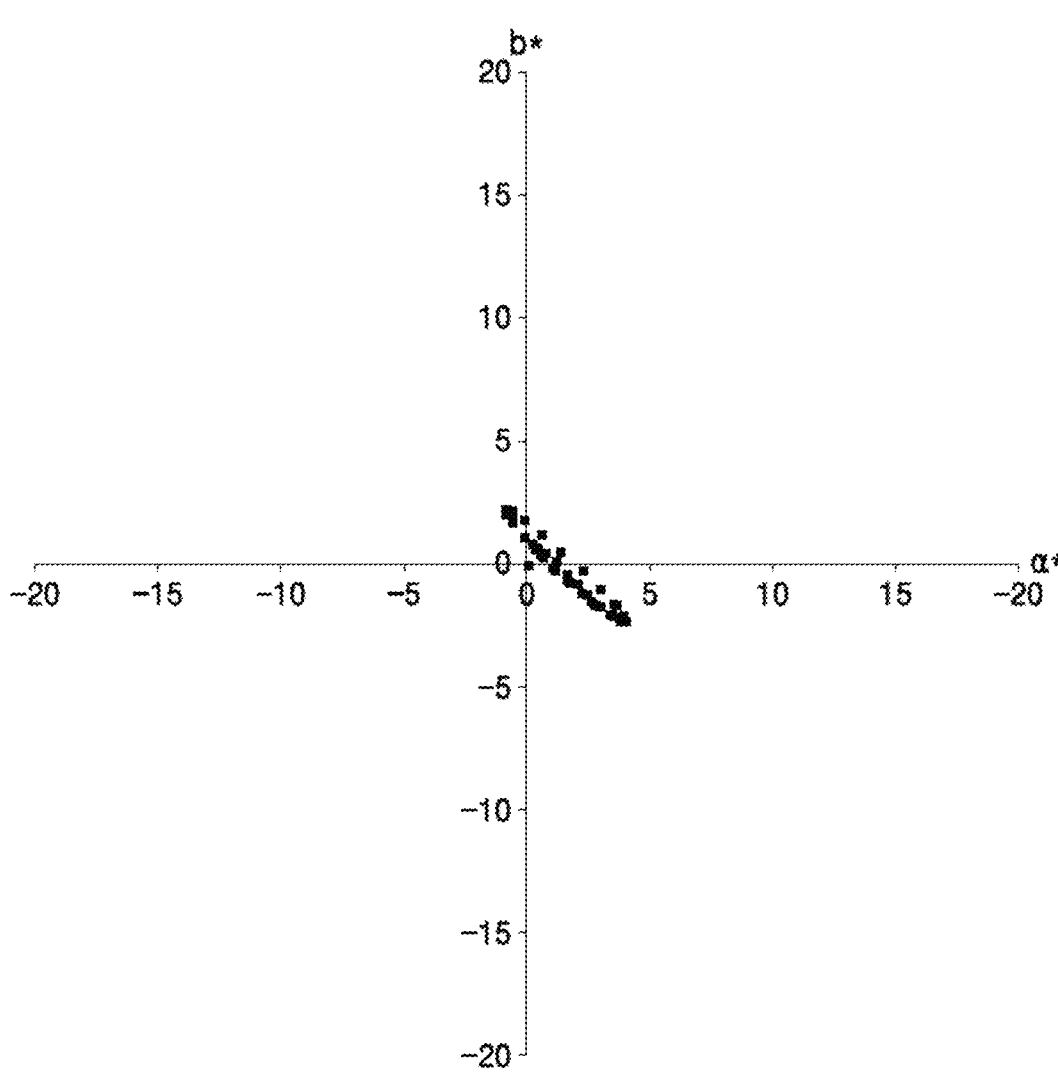
FIG. 11 illustrates a reflection color deviation for sample #1 in case that a polarization film includes a phase compensation layer.

FIG. 10 illustrates a reflection color deviation for sample #1 in case that a polarization film does not include a phase compensation layer. FIG. 11 illustrates a reflection color deviation for sample #1 in case that a polarization film includes a phase compensation layer. For example, FIG. 10 illustrates a reflection color deviation in case that a thickness direction phase difference for sample #1 is not compensated. FIG. 11 illustrates a reflection color deviation in case that a thickness direction phase difference for sample #1 is compensated. FIGS. 10 and 11 illustrate reflection color deviations measured in a specular component excluded (SCE) mode, a* and b* are coordinate values in a CIE L*a*b* coordinate system, and are values measured for an azimuth angle of φ=0 to 3600 at a polar angle of 60°.

Referring to FIGS. 10 and 11, in case that the polarization film 40 includes the phase compensation layer 430 and the thickness direction phase difference $C_{Rth}$ of the phase compensation layer 430 satisfies the above equation, a deviation of a* and b* values may be small, compared to a case where the polarization film 40 does not include the phase compensation layer 430. For example, in case that the polarization film 40 includes the phase compensation layer 430 and the thickness direction phase difference $C_{Rth}$ of the phase compensation layer 430 satisfies the above equation, a reflection color deviation of sample #1 may be small, compared to a case where the polarization film 40 does not include the phase compensation layer 430.

Figure 12:
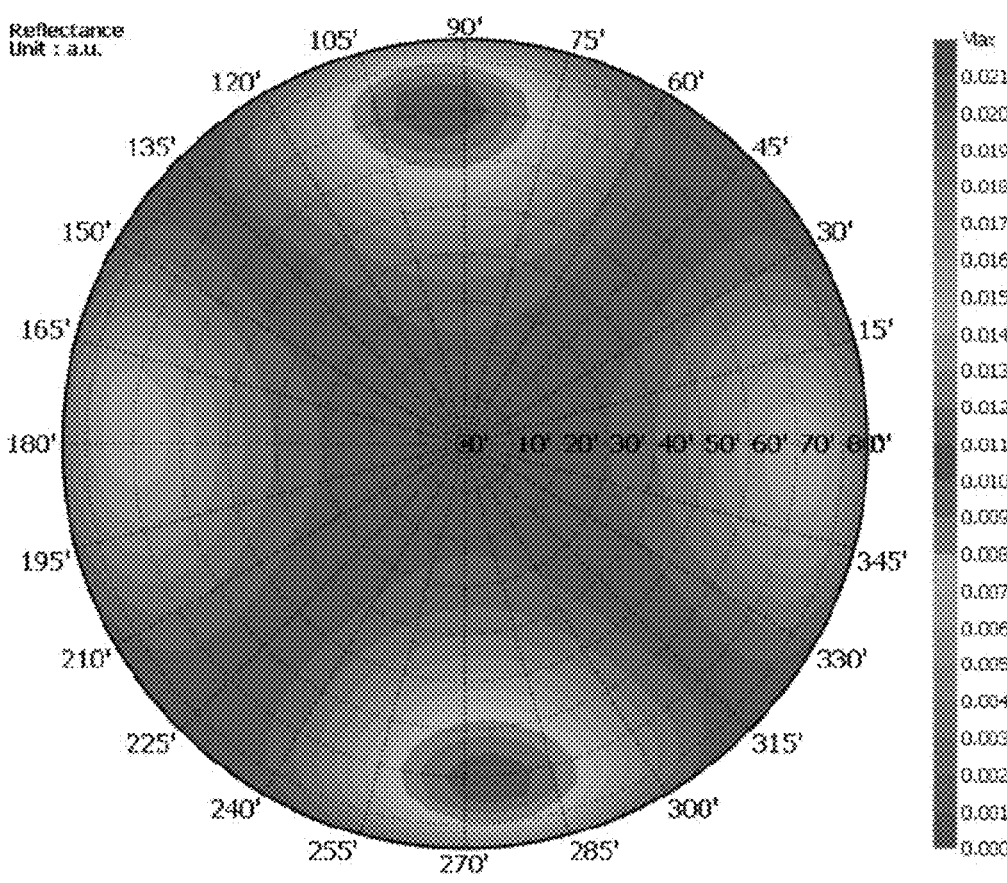
FIG. 12 illustrates a reflectance of sample #29 in case that a polarization film does not include a phase compensation layer.
Figure 13:
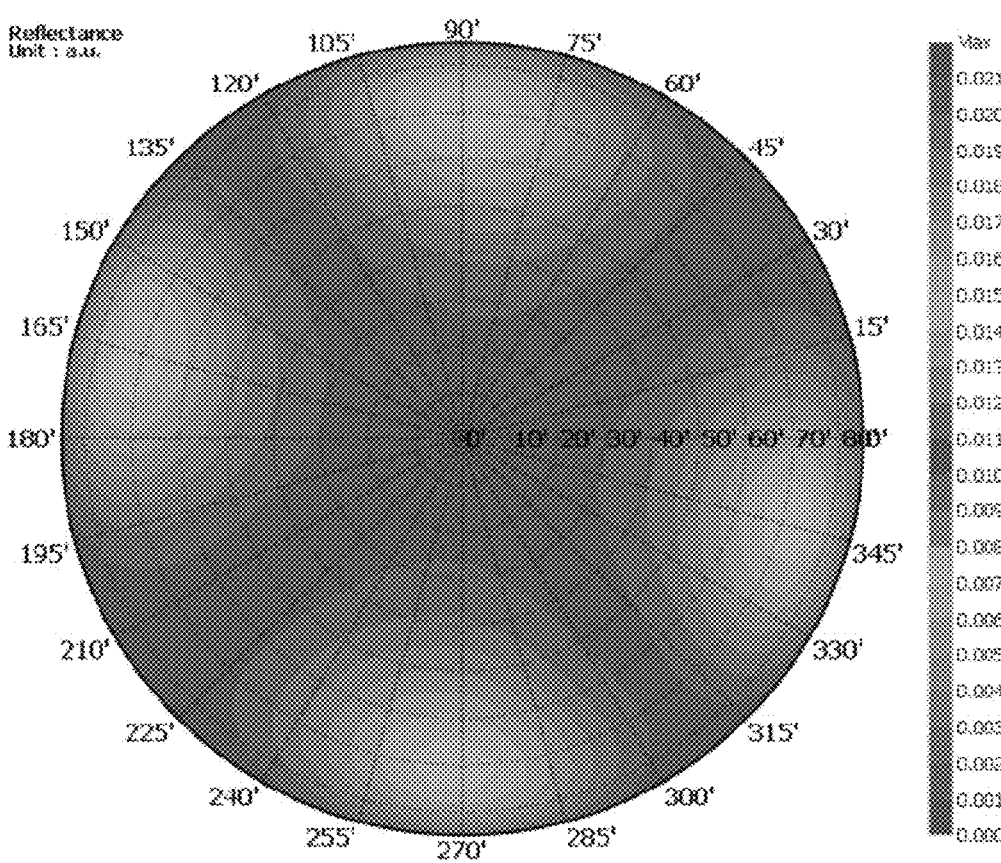
FIG. 13 illustrates a reflectance of sample #29 in case that a polarization film includes a phase compensation layer.

FIG. 12 illustrates a reflectance of sample #29 in case that a polarization film does not include a phase compensation layer. FIG. 13 illustrates a reflectance of sample #29 in case that a polarization film includes a phase compensation layer.

For example, FIG. 12 illustrates a reflectance in case that a thickness direction phase difference for sample #29 is not compensated. FIG. 13 illustrates a reflectance in case that a thickness direction phase difference for sample #29 is compensated. For example, FIG. 13 corresponds to a case where −31.1 nm that is the thickness direction phase difference $C_{Rth}$ of the phase compensation layer 430 for sample #29 is compensated. FIG. 12 corresponds to a case where the thickness direction phase difference for sample #29 is not compensated.

Referring to FIGS. 12 and 13, in case that the polarization film 40 includes the phase compensation layer 430 and the thickness direction phase difference $C_{Rth}$ of the phase compensation layer 430 satisfies the above equation, a reflectance of sample #29 may be reduced, compared to a case where the polarization film 40 does not include the phase compensation layer 430. For example, in case that the polarization film 40 includes the phase compensation layer 430 and the thickness direction phase difference $C_{Rth}$ of the phase compensation layer 430 satisfies the above equation, a reflectance of light on a side surface of the display apparatus 1 may be reduced, compared to a case where the polarization film 40 does not include the phase compensation layer 430.

Figure 14:
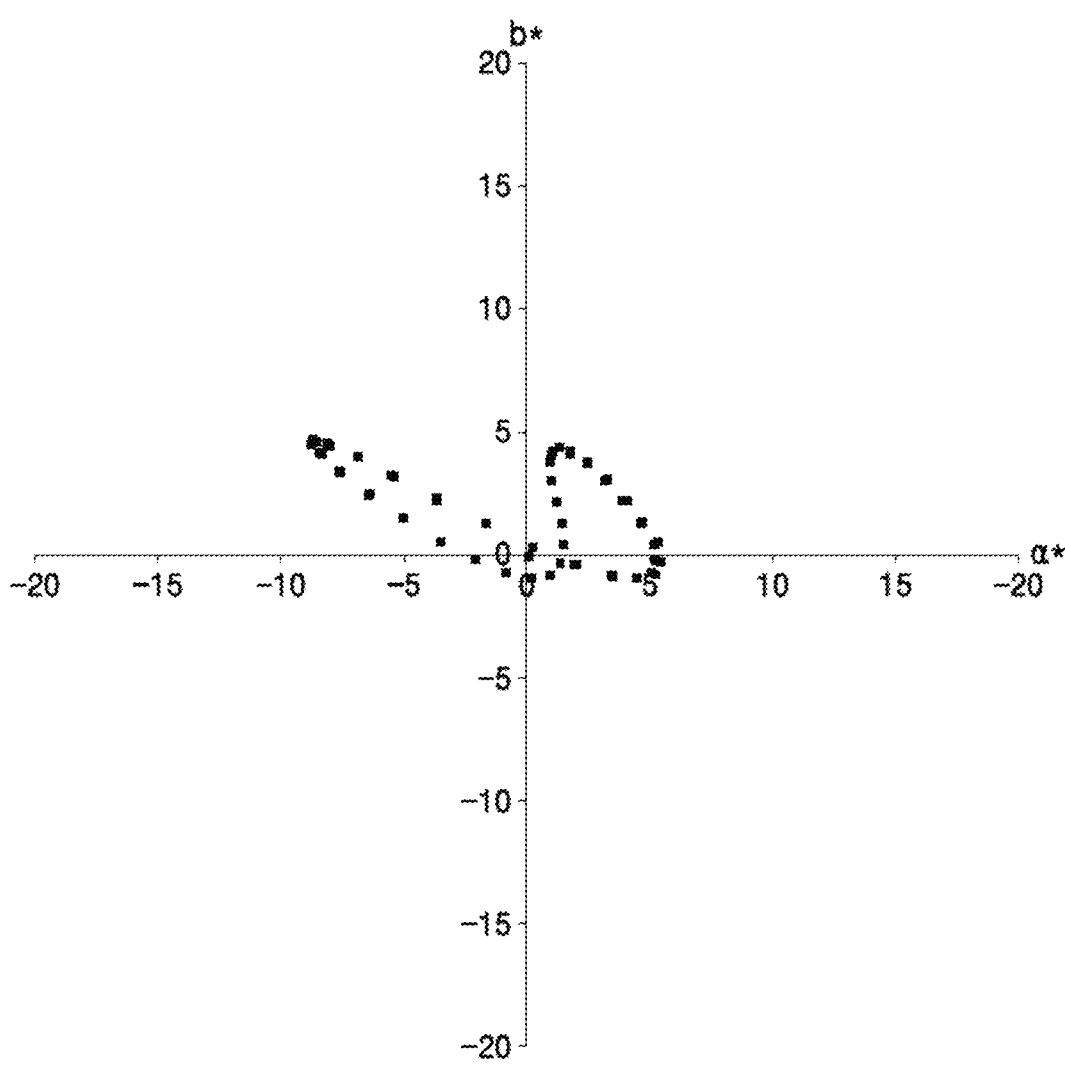
FIG. 14 illustrates a reflection color deviation for sample #29 in case that a polarization film does not include a phase compensation layer.
Figure 15:
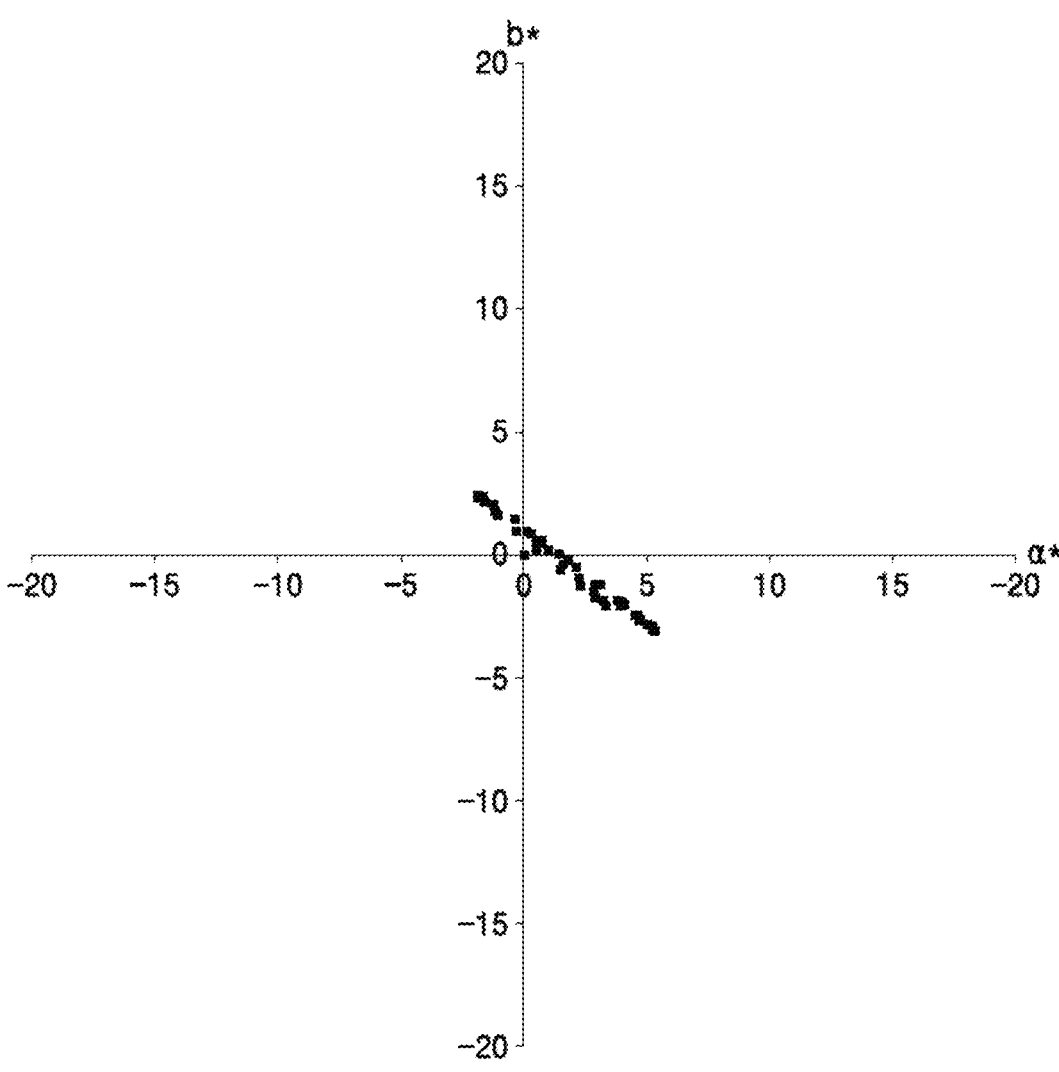
FIG. 15 illustrates a reflection color deviation for sample #29 in case that a polarization film includes a phase compensation layer.

FIG. 14 illustrates a reflection color deviation for sample #29 in case that a polarization film does not include a phase compensation layer. FIG. 15 illustrates a refection color deviation for sample #29 in case that a polarization film includes a phase compensation layer. For example, FIG. 14 illustrates a reflection color deviation in case that a thickness direction phase difference for sample #29 is not compensated. FIG. 15 illustrates a reflection color deviation in case that a thickness direction phase difference for sample #29 is compensated. FIGS. 14 and 15 illustrate reflection color deviations measured in an SCE mode, and a* and b* are coordinate values in a CIE L*a*b* coordinate system, and are values measured for an azimuth angle of φ=0 to 3600 at a polar angle of 60°.

Referring to FIGS. 14 and 15, in case that the polarization film 40 includes the phase compensation layer 430 and the thickness direction phase difference $C_{Rth}$ of the phase compensation layer 430 satisfies the above equation, a deviation of a* and b* values may be small, compared to a case where the polarization film 40 does not include the phase compensation layer 430. For example, in case that the polarization film 40 includes the phase compensation layer 430 and the thickness direction phase difference $C_{Rth}$ of the phase compensation layer 430 satisfies the above equation, a reflection color deviation of sample #29 may be small, compared to a case where the polarization film 40 does not include the phase compensation layer 430.

Referring to Table 1 and FIGS. 8 to 15, in case that the polarization film 40 includes the phase compensation layer 430, the thickness direction phase difference $C_{Rth}$ of the phase compensation layer 430 satisfies the above equation, and a phase shift of external light incident on a side surface is compensated, a reflectance of light incident on a side surface of the display apparatus 1 may be reduced and a reflection color deviation may be reduced. For example, a front reflectance and a side reflectance of the display apparatus 1 may be minimized and neutral black may be provided.

In an embodiment, as the thin-film encapsulation layer 300 and the resin layer 350 are provided between the substrate 100 and the encapsulation substrate 400, the mechanical strength of the display apparatus including the thin-film encapsulation layer 300 and the resin layer 350 may be improved. For example, in case that air (or nitrogen) is filled between the substrate 100 and the encapsulation substrate 400, as the mechanical strength which is dealt with only by frit disposed on an edge portion of the display panel 10. However, as the mechanical strength is dealt with by the entire display panel 10, the mechanical strength of the display apparatus including the display panel 10 may be improved.

As the thin-film encapsulation layer 300 and the resin layer 350, instead of air (or nitrogen), are provided between the substrate 100 and the encapsulation substrate 400, a white angular dependency (WAD) of the display apparatus may be improved and a transmittance of the display apparatus may be improved. For example, as the capping layer 220, the first inorganic encapsulation layer 310, the organic encapsulation layer 320, the second inorganic encapsulation layer 330, and the resin layer 350 having various refractive indices, instead of air (or nitrogen), are provided between the substrate 100 and the encapsulation substrate 400, a white angular dependency (WAD) of the display apparatus may be improved and a transmittance of the display apparatus may be improved. The WAD (white angular dependency) means a criterion that evaluates variation in characteristics of a white pattern according to an angle at which the white pattern of the display apparatus 1 (refer to FIG. 1) is viewed, and an amount of variation in luminance and an amount of variation in color coordinates relative to a front side perpendicular to a screen are measured to evaluate a level of the variation in characteristics of the white pattern. The WAD may mean a phenomenon in which a white color is changed to another color when viewing a white screen of a display at different angles. For example, a white light is visible from the front side of the display apparatus 1 (refer to FIG. 1), but a light having a wavelength other than the white may be viewed from a lateral side of the display device due to an optical path difference.

As a thickness direction phase difference of a phase compensation layer provided in a polarization film according to embodiments satisfies a preset equation, the visibility of a display apparatus including the polarization film may be improved.

In concluding the detailed description, those skilled in the art will appreciate that many variations and modifications may be made to the embodiments without substantially departing from the principles and spirit and scope of the disclosure. Therefore, the disclosed embodiments are used in a generic and descriptive sense only and not for purposes of limitation.

What is claimed is:

1. A display apparatus comprising:
   a display panel comprising a display element and a thin-film encapsulation layer disposed on the display element; and
   a polarization film disposed on the display panel and comprising a polarization layer, a phase retardation layer, and a phase compensation layer,
   wherein a thickness direction phase difference $C_{Rth}$ of the phase compensation layer satisfies Equation:

$$C_{Rth} = -((Re \times \sin^2(2\ominus) \times NZ)/2 + A_{Rth}),$$

where Re is $(Ne - No) \times d$, $\ominus$ is an angle between a slow axis of the phase retardation layer and a transmission axis of the polarization layer, NZ is $(Nx - Nz)/(Nx - Ny)$, $A_{Rth}$ is a thickness direction phase difference of the display panel, Ne is an extraordinary refractive index of the phase retardation layer, No is an ordinary refractive index of the phase retardation layer, Nx is an x-direction refractive index of the phase retardation layer, Ny is a y-direction refractive index of the phase retardation layer, Nz is a z-direction refractive index of the phase retardation layer, and d is a thickness of the phase retardation layer.

2. The display apparatus of claim 1, wherein the $\ominus$ is in a range of about 350 to about 55°.

3. The display apparatus of claim 1, wherein the Re is in a range of about 132 nm to about 152 nm at a wavelength of 550 nm.

4. The display apparatus of claim 1, wherein the $A_{Rth}$ is in a range of about −60 nm to about +10 nm.

5. The display apparatus of claim 1, wherein Re(550) at a wavelength of 550 nm and Re(450) at a wavelength of 450 nm satisfy Equation:

$$0.8 \leq Re(450)/Re(550) \leq 1.$$

6. The display apparatus of claim 1, wherein Re(650) at a wavelength of 650 nm and Re(550) at a wavelength of 550 nm satisfy Equation:

$$1 \leq Re(650)/Re(550) \leq 1.2.$$

7. The display apparatus of claim 1, wherein
   the phase compensation layer is disposed on the display panel,
   the phase retardation layer is disposed on the phase compensation layer, and
   the polarization layer is disposed on the phase retardation layer.

8. The display apparatus of claim 1, wherein
   the phase retardation layer is disposed on the display panel,
   the phase compensation layer is disposed on the phase retardation layer, and
   the polarization layer is disposed on the phase compensation layer.

9. The display apparatus of claim 1, wherein the thin-film encapsulation layer comprises at least one inorganic encapsulation layer and at least one organic encapsulation layer.

10. The display apparatus of claim 9, wherein the thin-film encapsulation layer comprises:
   a first inorganic encapsulation layer comprising at least one inorganic material, and
   a second inorganic encapsulation layer comprising at least one inorganic material.

11. The display apparatus of claim 1, further comprising a resin layer disposed on the thin-film encapsulation layer.

12. The display apparatus of claim 1, further comprising an encapsulation substrate disposed on the thin-film encapsulation layer.

13. The display apparatus of claim 1, wherein the display element comprises a pixel electrode, an emission layer, and a counter electrode.

14. The display apparatus of claim 13, further comprising a capping layer disposed on the counter electrode.

15. A display apparatus comprising:
   a substrate;
   a display element disposed on the substrate and comprising a pixel electrode, an emission layer, and a counter electrode;
   a capping layer disposed on the display element;
   a thin-film encapsulation layer disposed on the capping layer and comprising at least one inorganic encapsulation layer and at least one organic encapsulation layer;
   a resin layer disposed on the thin-film encapsulation layer; and a polarization film disposed on the resin layer and comprising a phase compensation layer, a phase retardation layer, and a polarization layer.

16. The display apparatus of claim 15, wherein the thin-film encapsulation layer comprises:

a first inorganic encapsulation layer comprising at least one inorganic material, an organic encapsulation layer, and a second inorganic encapsulation layer comprising at least one inorganic material.

17. The display apparatus of claim 15, further comprising an encapsulation substrate disposed on the resin layer.

18. The display apparatus of claim 15, wherein the phase compensation layer is disposed on the resin layer, the phase retardation layer is disposed on the phase compensation layer, and the polarization layer is disposed on the phase retardation layer.

19. The display apparatus of claim 15, wherein the phase retardation layer is disposed on the resin layer, the phase compensation layer is disposed on the phase retardation layer, and the polarization layer is disposed on the phase compensation layer.

20. The display apparatus of claim 15, wherein the polarization film further comprises:

a first protective layer disposed on the polarization layer, and a second protective layer disposed between the polarization layer and the phase retardation layer.

* * * * *